United States Patent
DeCusatis et al.

(10) Patent No.: US 8,140,034 B2
(45) Date of Patent: Mar. 20, 2012

(54) FREQUENCY LOCKED FEEDBACK LOOP FOR WIRELESS COMMUNICATIONS

(75) Inventors: Casimer M. DeCusatis, Poughkeepsie, NY (US); Lawrence Jacobowitz, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 311 days.

(21) Appl. No.: 12/624,677

(22) Filed: Nov. 24, 2009

(65) Prior Publication Data

US 2011/0122983 A1    May 26, 2011

(51) Int. Cl.
*H04B 1/04*    (2006.01)
(52) U.S. Cl. .......... 455/126; 455/315; 455/59; 455/266; 455/255; 455/205; 375/376; 375/259
(58) Field of Classification Search .................. 455/126, 455/315, 59, 266, 255, 205; 375/376, 259
See application file for complete search history.

(56) References Cited

U.S. PATENT DOCUMENTS

| | | | | |
|---|---|---|---|---|
| 4,494,238 A | * | 1/1985 | Groth, Jr. | 375/141 |
| 6,301,306 B1 | * | 10/2001 | McDonald et al. | 375/259 |
| 7,061,944 B2 | | 6/2006 | DeCusatis et al. | |
| 2004/0102170 A1 | * | 5/2004 | Jensen et al. | 455/260 |
| 2010/0135368 A1 | * | 6/2010 | Mehta et al. | 375/219 |

* cited by examiner

*Primary Examiner* — Sanh Phu
(74) *Attorney, Agent, or Firm* — Cantor Colburn LLP; Steven Chiu

(57) ABSTRACT

A method and systems for a frequency locked feedback loop for wireless communications are provided. The method includes applying dither modulation from a harmonic modulator to modulated data at a transmit source, and mixing the dither modulation at a dither modulation frequency with the modulated data at a wireless carrier frequency to produce a modulated signal. The method also includes filtering and splitting the modulated signal using a bandpass filter to produce a wireless output signal and a feedback signal. The method further includes determining a frequency error in the feedback signal as a function of alignment of the wireless carrier frequency to a target frequency in a frequency response of the bandpass filter. The method additionally includes adjusting the wireless carrier frequency in response to the frequency error to establish a frequency lock between the wireless carrier frequency and the target frequency.

20 Claims, 7 Drawing Sheets

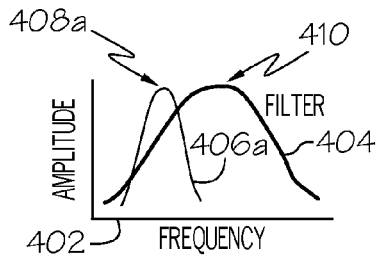
FIG. 4A
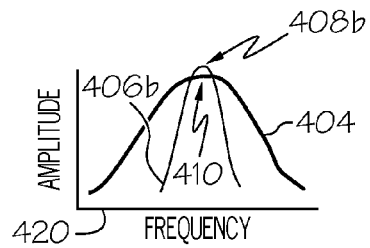
FIG. 4B
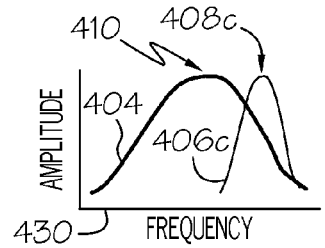
FIG. 4C
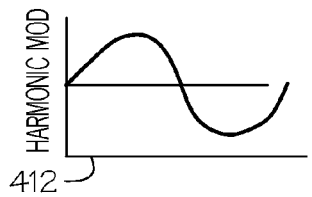
FIG. 4D
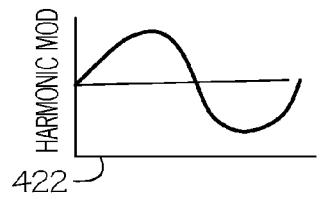
FIG. 4E
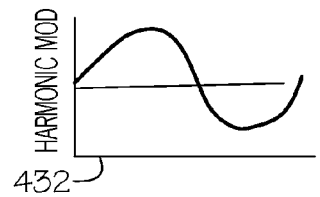
FIG. 4F
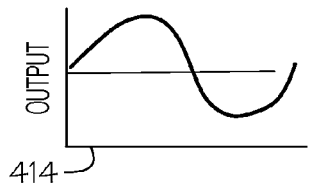
FIG. 4G
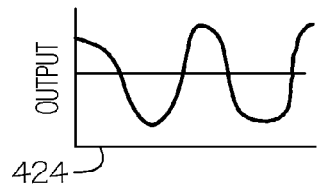
FIG. 4H
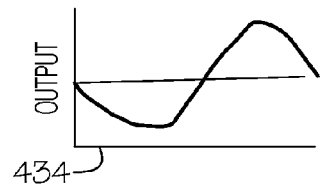
FIG. 4I
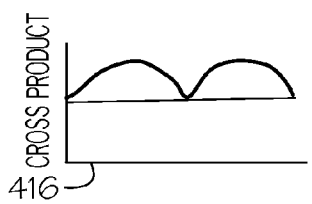
FIG. 4J
ZERO
426
FIG. 4K
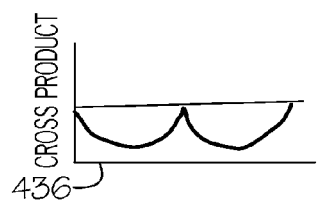
FIG. 4L
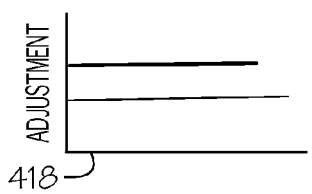
FIG. 4M
FIG. 4N
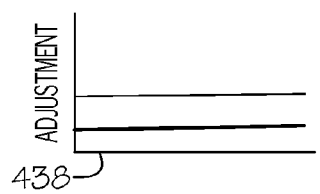
FIG. 4O

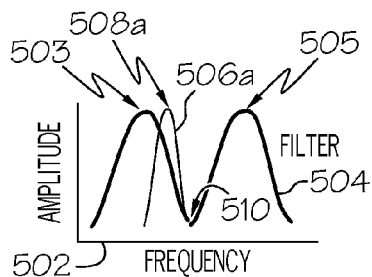
FIG. 5A
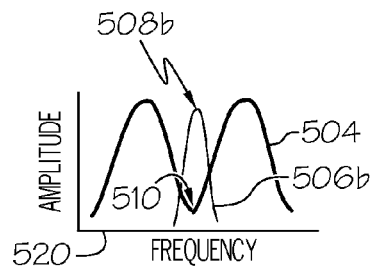
FIG. 5B
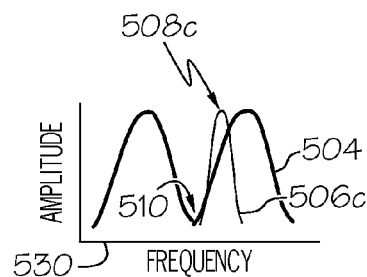
FIG. 5C
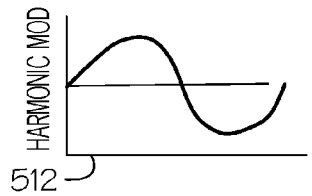
FIG. 5D
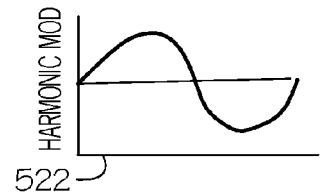
FIG. 5E
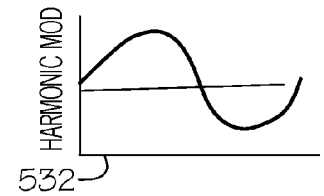
FIG. 5F
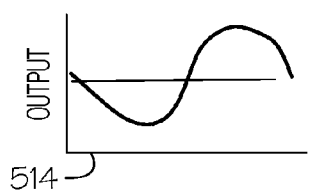
FIG. 5G
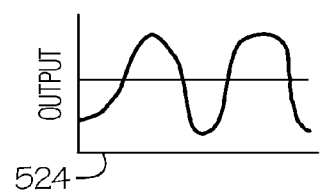
FIG. 5H
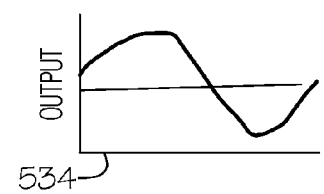
FIG. 5I
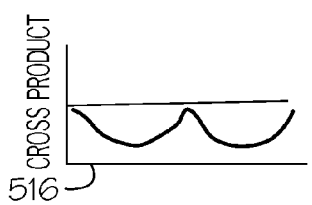
FIG. 5J
ZERO
526
FIG. 5K
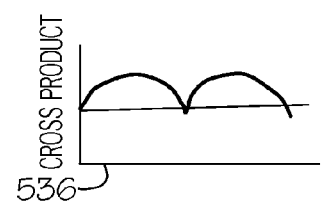
FIG. 5L
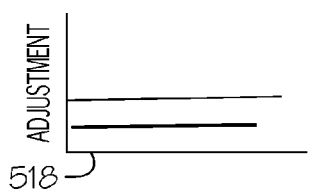
FIG. 5M
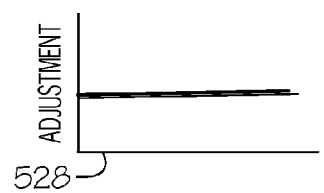
FIG. 5N
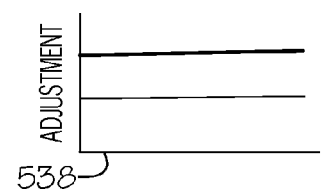
FIG. 5O

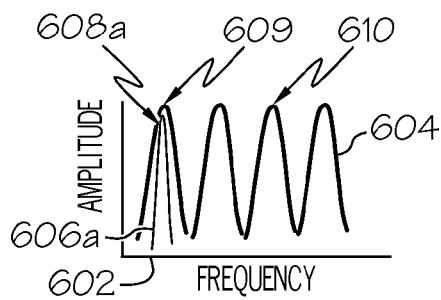
FIG. 6A
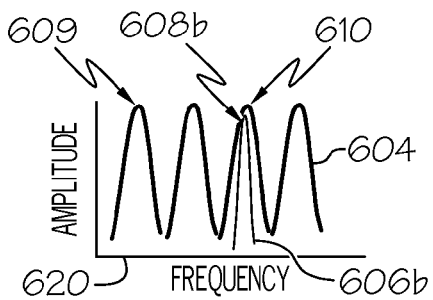
FIG. 6B
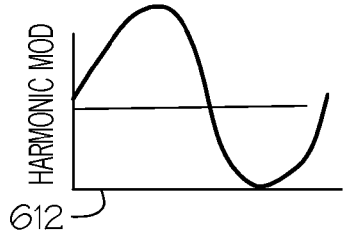
FIG. 6C
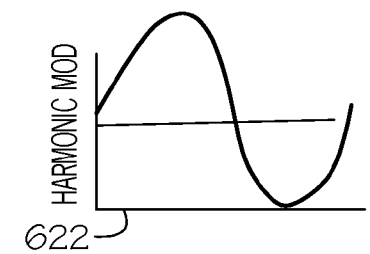
FIG. 6D
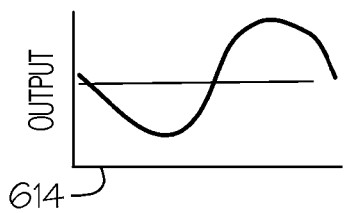
FIG. 6E
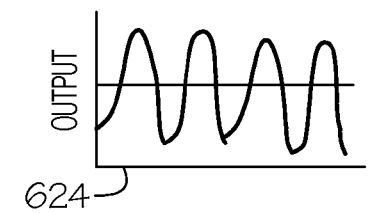
FIG. 6F
NON-ZERO
616
FIG. 6G
ZERO
626
FIG. 6H
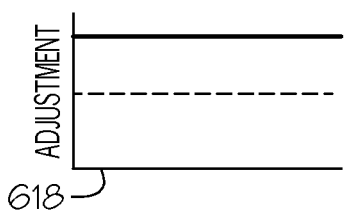
FIG. 6I
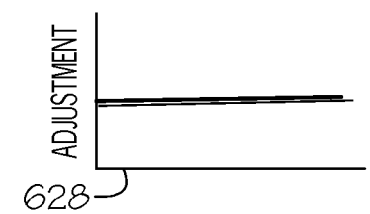
FIG. 6J

FREQUENCY LOCKED FEEDBACK LOOP FOR WIRELESS COMMUNICATIONS

BACKGROUND

The present invention relates generally to wireless signal processing, and, in particular, to a frequency locked feedback loop for wireless communications.

Currently available wireless communication systems can incorporate well over one hundred (or more) distinct frequency channels. Frequency tuning functions to select frequency channels typically tune to a single frequency in an attempt to match a single filter peak. Tuning functions, such as phase locked loops (PLLs), often perform tuning fairly close to the filter peak.

PLLs typically operate on a feedback loop mechanism that attempts to minimize the phase difference between a target signal and an adjustable signal, thereby phase aligning the two signals. While PLLs can be effective, they have a number of shortcomings. For example, a PLL can unintentionally lock onto harmonics of the target frequency, rather than the target frequency itself. PLLs can suffer from common phase-noise and susceptibility to jitter and skew, known as "skitter". Capture, lock, and voltage fluctuations may destabilize PLLs. Additionally, PLLs typically rely on a single point solution, where a control circuit attempts to drive phase-error to a null or zero value, which can increase the chance of a false lock while also requiring a continuous reference clock to maintain a lock and generate an output frequency. PLLs and other frequency tuning functions typically cannot be used to align with the valley between two filter peaks.

SUMMARY

Embodiments of the invention include a method for providing a frequency locked feedback loop for wireless communications. The method includes applying dither modulation from a harmonic modulator to modulated data at a transmit source, and mixing the dither modulation at a dither modulation frequency with the modulated data at a wireless carrier frequency to produce a modulated signal. The method also includes filtering and splitting the modulated signal using a bandpass filter to produce a wireless output signal and a feedback signal. The method further includes determining a frequency error in the feedback signal as a function of alignment of the wireless carrier frequency to a target frequency in a frequency response of the bandpass filter. The method additionally includes adjusting the wireless carrier frequency in response to the frequency error to establish a frequency lock between the wireless carrier frequency and the target frequency.

Additional embodiments include a system for a frequency locked feedback loop for wireless communications. The system includes a harmonic modulator to produce a dither modulation at a dither modulation frequency, and a transmit source configured to mix the dither modulation at the dither modulation frequency with modulated data at a wireless carrier frequency to produce a modulated signal. The system also includes a bandpass filter and splitter in communication with the transmit source and configured to output a wireless output signal and a feedback signal from the modulated signal. The system further includes a frequency adjustment function configured to determine frequency error in the feedback signal as a function of alignment of the wireless carrier frequency to a target frequency in a frequency response of the bandpass filter and command adjustment of the wireless carrier frequency in response to the frequency error to establish a frequency lock between the wireless carrier frequency and the target frequency.

Further embodiments include a wireless communication security system. The wireless communication security system includes a multicore device in communication with a plurality of frequency locked feedback loops. The plurality of frequency locked feedback loops are independently configurable to lock on separate target frequencies and output modulated data on wireless carrier frequencies aligned with the separate target frequencies. The multicore device is configured to periodically modify the separate target frequencies to provide frequency tunable security for communications over a wireless network.

Other systems, methods, apparatuses, and/or design structures according to embodiments will be or become apparent to one with skill in the art upon review of the following drawings and detailed description. It is intended that all such additional systems, methods, apparatuses, and/or design structures be included within this description, be within the scope of the present invention, and be protected by the accompanying claims.

BRIEF DESCRIPTION OF THE SEVERAL VIEWS OF THE DRAWINGS

Referring now to the drawings wherein like elements are numbered alike in the several FIGURES:

FIG. 4 depicts examples of signal frequency adjustments around a single frequency peak;

FIG. 5 depicts examples of signal frequency adjustments around a valley between two frequency peaks;

FIG. 6 depicts examples of signal frequency adjustments between frequency points on a comb filter.

DETAILED DESCRIPTION

Exemplary embodiments provide frequency locked feedback loops (FLLs) to support wireless communications. An FLL employs closed loop feedback control to maintain a desired output frequency based on an error function. Once the frequency is locked, it remains stable over time and compensates for environmental variations such as changes in temperature, voltage, and the like. The frequency may be unlocked, stepped to a new value, and re-locked as many times as desired. Exemplary embodiments also perform non-equilibrium frequency tracking to provide more than point optimization for tracking a non-peak value, including a steady-state lock to a nulling function.

Figure 1:
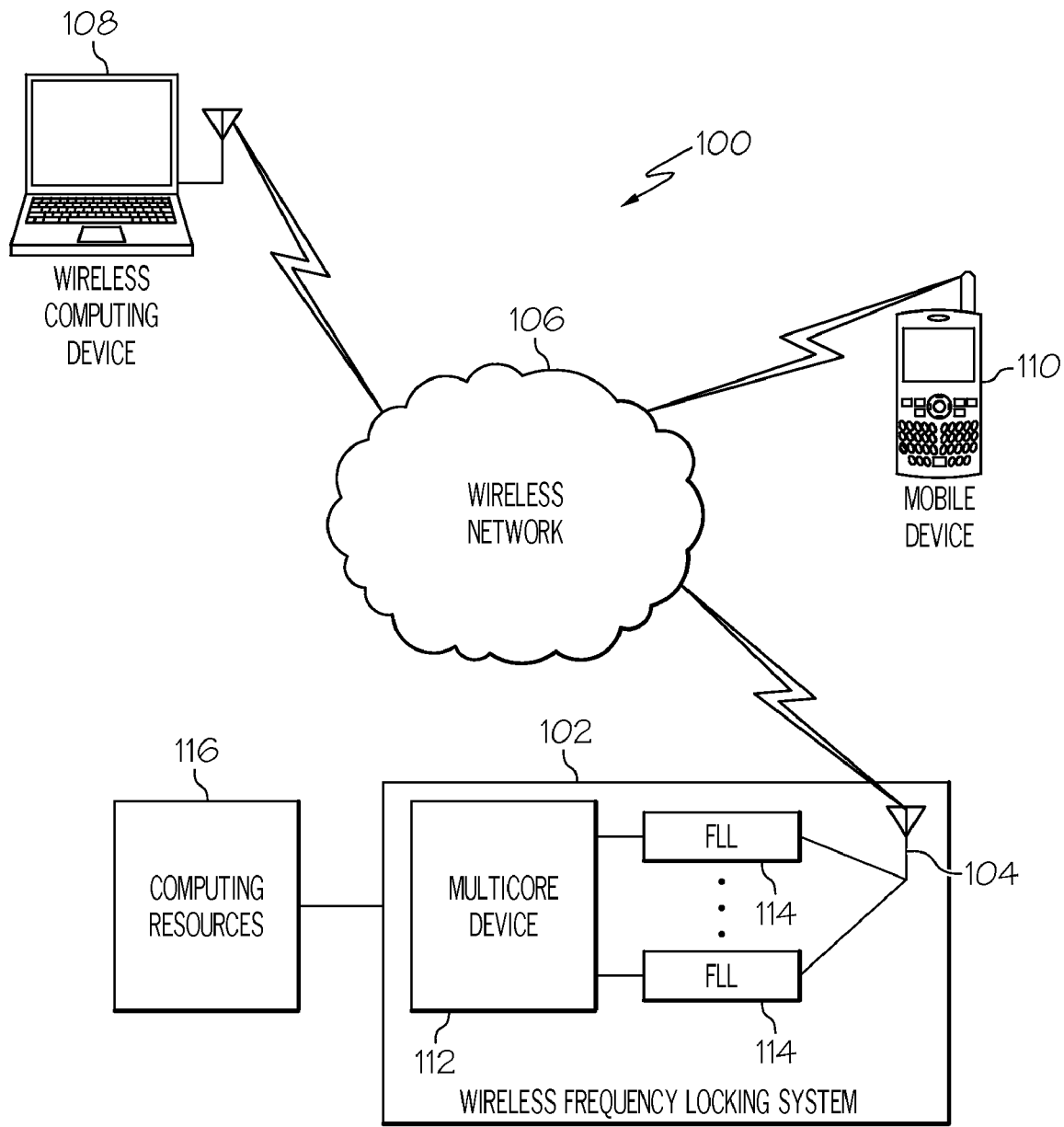
FIG. 1 depicts a wireless system supporting frequency locked feedback loops for wireless communications in accordance with exemplary embodiments.

Turning now to the drawings, it will be seen that in FIG. 1 there is a block diagram of wireless system 100 supporting frequency locked feedback loops for wireless communications. The wireless system 100 includes a wireless frequency locking system 102 configured to establish wireless communication through antenna 104 to a wireless network 106. The wireless frequency locking system 102 may communication with a variety of wireless devices or systems through the wireless network 106. For example, the wireless frequency locking system 102 can communicate with one or more wireless computing devices 108 and/or mobile devices 110. The wireless computing devices 108 can include laptop computers, desktop computers, and/or other devices or systems known in the art that utilize one or more processing circuits. The one or more mobile devices 110 can be any type of handheld device, personal digital assistant, or portable wireless device. Examples of the types of communications that may be supported by the wireless network 106 include Wi-Fi, 4G, Bluetooth, and other wireless protocols.

In exemplary embodiments, the wireless frequency locking system 102 includes a multicore device 112 that utilizes multiple frequency locked feedback loops (FLLs) 114 as a communication front-end for transmitting data over wireless network 106 via antenna 104. The multicore device 112 may be an application specific integrated circuit (ASIC) that supports parallel communication channels using the FLLs 114. Each core in the multicore device 112 can execute separate threads in parallel and establish independent communication channels for wireless communication. The FLLs 114 are independently tunable to isolated communication channels in the frequency domain. Once frequency locks are established, the multicore device 112 may perform tasks such as deep packet inspection and authentication. The FLLs 114 can be used for wireless security by periodically changing transmission frequencies. The dynamically adjustable characteristics of the FLLs 114 allow for updates in wireless standards, including inter-channel spacing and communication frequency bands.

The multicore device 112 may also interface with computing resources 116. For example, the computing resources 116 can be one or more computers supporting service oriented architectures and various Web 2.0 functions. In an exemplary embodiment, the wireless frequency locking system 102 serves as a wireless communication firewall with respect to the computing resources 116.

Figure 2:
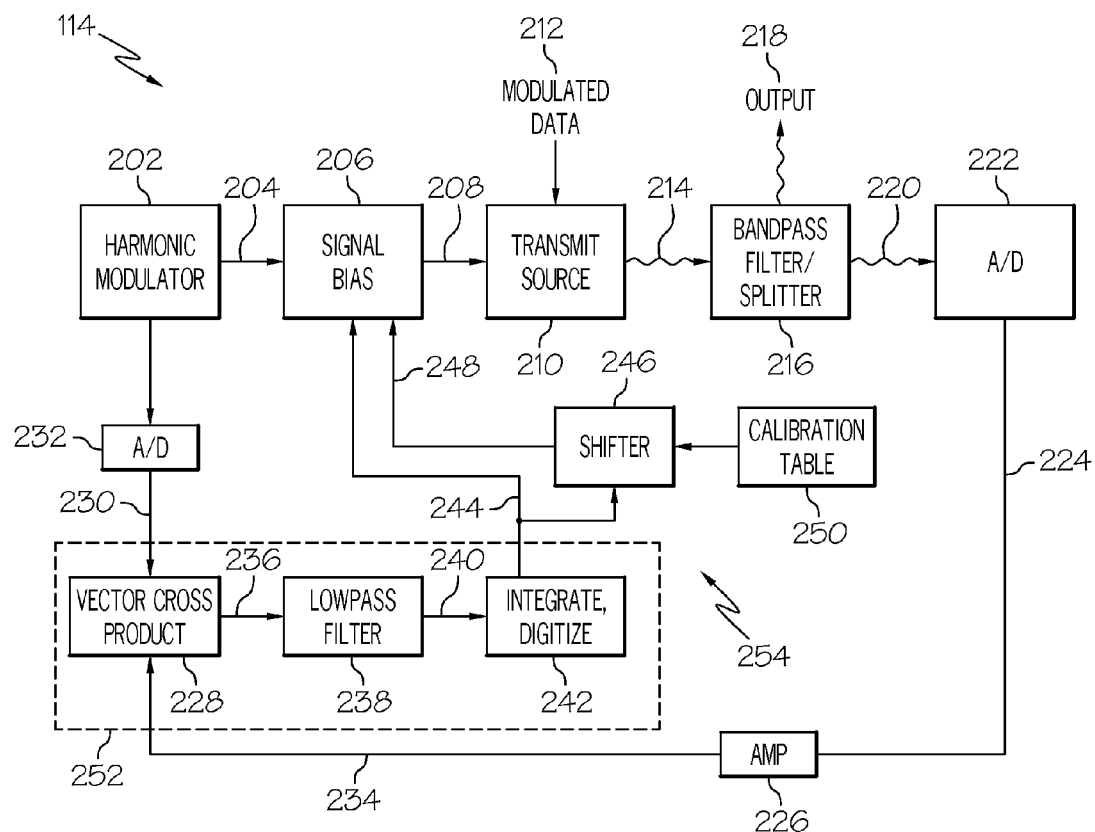
FIG. 2 depicts a block diagram of a frequency locked feedback loop in accordance with exemplary embodiments.

Turning now to FIG. 2, a block diagram of FLL 114 of FIG. 1 is depicted in greater detail. A harmonic modulator 202 provides a dither modulation signal 204 at a dither modulation frequency to a signal bias block 206. The harmonic modulator 202 can output a simple harmonic sinusoid, but the dither modulation signal 204 may be any periodic waveform such as a square wave, sawtooth, or others tailored for different applications. The dither modulation frequency is generally much lower than the transmission frequency of the wireless transmission, for instance, several kilohertz or less. The signal bias block 206 supplies an input 208 to a transmit source 210. The transmit source 210 mixes the input 208 with modulated data 212 to produce a modulated signal 214. The modulated data 212 may be received from the multicore device 112 of FIG. 1. The modulated signal 214 includes the modulated data 212, which is modulated with respect to a wireless carrier frequency and is also dither modulated with respect to the harmonic modulator 202. The frequency characteristics of the modulated signal 214 can be modified by the signal bias block 206 to shift the modulated signal 214 in the frequency domain. For example, the signal bias block 206 may drive a voltage controlled oscillator in the transmit source 210 for wireless carrier frequency adjustment. The dither modulation appears as a relatively small slowly moving variation in the modulated signal 214.

A bandpass filter/splitter 216 may be used to filter and split the modulated signal 214 into wireless output signal 218 and feedback signal 220 as radio frequency (RF) signals. The wireless output signal 218 can be sent to antenna 104 of FIG. 1 for transmission on the wireless network 106 of FIG. 1. The frequency response of the bandpass filter/splitter 216 need not be limited to a single peak nor represent a Gaussian function. The bandpass filter/splitter 216 routes the majority of the filtered spectral energy to wireless output signal 218, with a small fraction routed to feedback signal 220, for instance, a 99%-to-1% split. The bandpass filter/splitter 216 can support a wide number of split ratios, subject to signal-to-noise ratio constraints. A fast analog-to-digital (A/D) converter 222 samples the feedback signal 220 and sends a sampled feedback signal 224 to amplifier 226. Note that the amplifier 226 can alternatively be placed prior to the fast A/D converter 222. The amplifier 226 increases the dynamic range of the feedback path and/or performs signal rescaling prior to further analysis.

A vector cross product function 228 receives a sampled dither modulation signal 230 from an A/D converter 232 and an amplified sampled feedback signal 234 from the amplifier 226 and the fast A/D converter 222. In exemplary embodiments, the vector cross product function 228 calculates a vector cross product signal 236 of the sampled dither modulation signal 230 and the amplified sampled feedback signal 234. The vector cross product signal 236 includes frequency components at sum and difference frequencies of dither and filtered feedback frequencies from the sampled dither modulation signal 230 and the amplified sampled feedback signal 234. The vector cross product signal 236 may be filtered via a lowpass filter 238, with filtered vector cross product 240 integrated and digitized over a period of time via integrate and digitize function 242.

The integrate and digitize function 242 produces an averaged frequency error signal 244 that can be positive or negative depending upon whether there is a misalignment between the wireless carrier frequency of the modulated signal 214 and a target frequency in the frequency response of the bandpass filter/splitter 216. The amplitude of the averaged frequency error signal 244 is proportional to an offset between the wireless carrier frequency and the target frequency. A phase offset of the averaged frequency error signal 244 is positive or negative as function of the wireless carrier frequency being higher or lower than the target frequency. The output of the integrate and digitize function 242 is passed as an adjustment command to the signal bias block 206 to compensate for the frequency error by adjusting the wireless carrier frequency.

Optionally, a shifter function 246 can make additional adjustments to the signal bias block 206 on link 248. The shifter function 246 may receive the averaged frequency error signal 244 and apply frequency adjustments based on calibration table 250. The calibration table 250 can be used to optimize transmission under a wide range of environments, for example, compensating for atmospheric specific attenuation. A digital-to-analog (D/A) converter can be included between the integrate and digitize function 242 and the signal bias block 206, as well as between the shifter function 246 and the signal bias block 206 depending analog or digital signaling requirements at the signal bias block 206.

The vector cross product function 228, lowpass filter 238, and integrate and digitize function 242 are collectively referred to as frequency adjustment function 252. The frequency adjustment function 252, shifter 246, calibration table 250, amplifier 226 and/or A/D converters 222 and 232 can be implemented in digital signal processing (DSP) circuitry 254. The DSP circuitry 254 may be incorporated in one or more integrated circuits, including ASICs, programmable logic devices, and/or digital signal processors.

Using multiple instances of the FLL 114, the multicore device 112 of FIG. 1 can add or drop selected frequencies and apply frequency control, tuning, and stabilization in the transmission of wireless signals. The FLL 114 can dynamically adjust the wireless carrier frequency of the modulated signal 214 to align with any arbitrary point within the frequency response of the bandpass filter/splitter 216. The feedback signal 220 is processed to yield a magnitude and direction of offset between the wireless carrier frequency of the modulated signal 214 and a target frequency within the frequency response of the bandpass filter/splitter 216. Using this servo error signal, the wireless carrier frequency of the modulated signal 214 can be adjusted to track along the filter curve as the target frequency changes. For example, the FLL 114 can selectively attenuate a given frequency channel or shift frequencies between adjacent channels in the wireless network 106 of FIG. 1. The FLL 114 enables nonequilibrium frequency tracking capable of providing more than a point optimization locking onto the center of the passband; it provides a steady-state lock to a nulling function.

Figure 3:
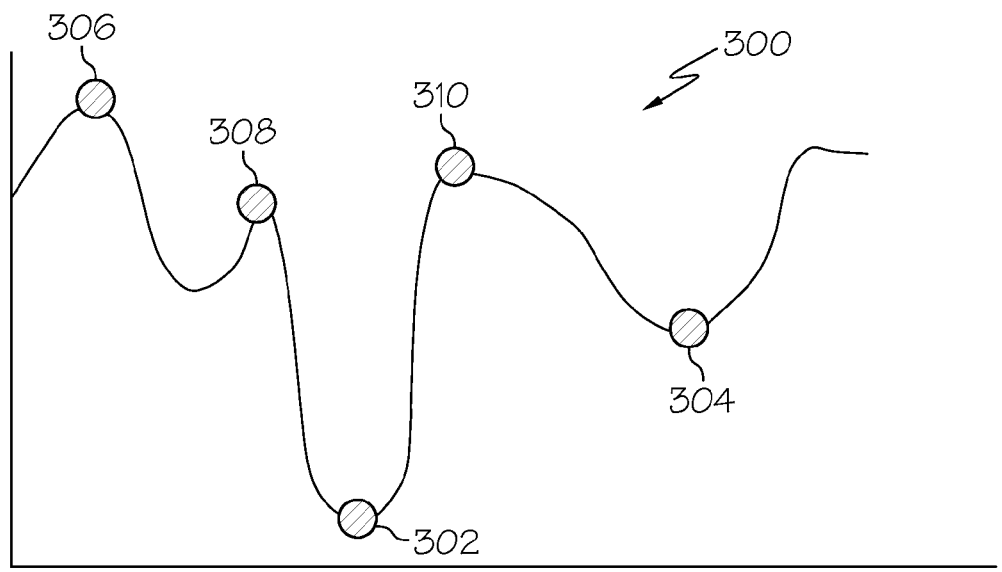
FIG. 3 depicts an example of an arbitrary error function with multiple local minima and maxima.

FIG. 3 depicts an example of an arbitrary error function 300 with multiple local minima and maxima. The arbitrary error function 300 includes local minima 302 and 304, as well as local maxima 306, 308, and 310. The local minimum 302 is the absolute minimum and the local maximum 306 is the absolute maximum for the arbitrary error function 300. The arbitrary error function 300 represents an example of a frequency error encountered by the FLL 114 of FIGS. 1 and 2. While a PLL attempting to locate the absolute maximum when starting in near local maximum 308 may lock onto local maximum 308 instead of maximum 306, the FLL 114 can perform wide scale optimization for many effects including tracking to any arbitrary point.

FIG. 4 depicts examples of signal frequency adjustments around a single frequency peak. Plot 402 is a frequency response 404 of the bandpass filter/splitter 216 of FIG. 2. Modulated frequency spectrum 406a represents frequency content of the modulated signal 214 of FIG. 2, with a wireless carrier frequency 408a at the center of the modulated frequency spectrum 406a. Target frequency 410 in this example is located at the center of the frequency response 404. Plot 412 is an example of the dither modulation signal 204 of FIG. 2. Plot 414 is an example of the dither modulation frequency component of the modulated frequency spectrum 406a after passing through the frequency response 404. Plot 416 represents the vector cross product signal 236 of FIG. 2, and plot 418 is an example of the averaged frequency error signal 244 of FIG. 2 used for frequency adjustment. Since there is a misalignment between the wireless carrier frequency 408a and the targeted frequency 410, plot 418 representing the averaged frequency error signal 244 of FIG. 2 indicates a relative direction and amount to shift the wireless carrier frequency 408a.

Plot 420 depicts alignment of the wireless carrier frequency 408b of modulated frequency spectrum 406b relative to the targeted frequency 410, where modulated frequency spectrum 406b and wireless carrier frequency 408b are frequency adjusted versions of modulated frequency spectrum 406a and wireless carrier frequency 408a. Plot 422 is an example of the dither modulation signal 204 of FIG. 2. Plot 424 represents the dither modulation frequency component of the modulated frequency spectrum 406b after passing through the frequency response 404. Plot 426 is an example of the vector cross product signal 236 of FIG. 2, and plot 428 illustrates the averaged frequency error signal 244 of FIG. 2 used for frequency adjustment. Since wireless carrier frequency 408b aligns with targeted frequency 410, the dither modulation frequency doubles, resulting in the vector cross product signal 236 of FIG. 2 being zero and the averaged frequency error signal 244 of FIG. 2 being zero, as shown in plots 424-428, thus no change is made to the signal bias block 206. It will be understood that a tolerance band may be applied to determine frequency alignment.

Plot 430 depicts a misalignment of the wireless carrier frequency 408c of modulated frequency spectrum 406c relative to the targeted frequency 410, where modulated frequency spectrum 406c and wireless carrier frequency 408c are frequency adjusted versions of modulated frequency spectrum 406a and wireless carrier frequency 408a. Plot 432 is an example of the dither modulation signal 204 of FIG. 2. Plot 434 is an example of the dither modulation frequency component of the modulated frequency spectrum 406c after passing through the frequency response 404. The phase of plot 434 is opposite from that of plot 414. Plot 436 is an example of the vector cross product signal 236 of FIG. 2, and plot 438 is an example of the averaged frequency error signal 244 of FIG. 2 used for frequency adjustment. Since the targeted frequency 410 is less than the wireless carrier frequency 408c, the averaged frequency error signal 244 of FIG. 2 is negative in phase and indicates an amount of shift needed to align the targeted frequency 410 and the wireless carrier frequency 408c.

FIG. 5 depicts examples of signal frequency adjustments around a valley or null between two frequency peaks. Plot 502 depicts a frequency response 504 of the bandpass filter/splitter 216 of FIG. 2 with multiple frequency peaks 503 and 505. Modulated frequency spectrum 506a represents frequency content of the modulated signal 214 of FIG. 2, with a wireless carrier frequency 508a at the center of the modulated frequency spectrum 506a. Target frequency 510 in this example is located at a null of the frequency response 504 between frequency peaks 503 and 505. Plot 512 is an example of the dither modulation signal 204 of FIG. 2. Plot 514 is an example of the dither modulation frequency component of the modulated frequency spectrum 506a after passing through the frequency response 504. Plot 516 represents the vector cross product signal 236 of FIG. 2, and plot 518 is an example of the averaged frequency error signal 244 of FIG. 2 used for frequency adjustment. Since there is a misalignment between the wireless carrier frequency 508a and the targeted frequency 510, plot 518 representing the averaged frequency error signal 244 of FIG. 2 indicates a relative direction and amount to shift the wireless carrier frequency 508a.

Plot 520 depicts alignment of the wireless carrier frequency 508b of modulated frequency spectrum 506b relative to the targeted frequency 510, where modulated frequency spectrum 506b and wireless carrier frequency 508b are frequency adjusted versions of modulated frequency spectrum 506a and wireless carrier frequency 508a. Plot 522 is an example of the dither modulation signal 204 of FIG. 2. Plot 524 illustrates the dither modulation frequency component of the modulated frequency spectrum 506b after passing through the frequency response 504. Plot 526 is an example of the vector cross product signal 236 of FIG. 2, and plot 528 is an example of the averaged frequency error signal 244 of FIG. 2 used for frequency adjustment. Since wireless carrier frequency 508b aligns with targeted frequency 510, the dither modulation frequency doubles, resulting in the vector cross product signal 236 of FIG. 2 being zero and the averaged frequency error signal 244 of FIG. 2 being zero, as shown in plots 524-528, thus no change is made to the signal bias block 206. Comparing plot 524 having a null aligned frequency to plot 424 of FIG. 4 having a peak aligned frequency, it can be seen that a 180 degree phase difference occurs depending on null or peak alignment. Thus, this phase relationship can be used to distinguish between null and peak alignment.

Plot 530 depicts a misalignment of the wireless carrier frequency 508c of modulated frequency spectrum 506c relative to the targeted frequency 510, where modulated frequency spectrum 506c and wireless carrier frequency 508c are frequency adjusted versions of modulated frequency spectrum 506a and wireless carrier frequency 508a. Plot 532 is an example of the dither modulation signal 204 of FIG. 2. Plot 534 represents the dither modulation frequency component of the modulated frequency spectrum 506c after passing through the frequency response 504. The phase of plot 534 is opposite from that of plot 514. Plot 536 is an example of the vector cross product signal 236 of FIG. 2, and plot 538 is an example of the averaged frequency error signal 244 of FIG. 2 used for frequency adjustment. In this example, the targeted frequency 510 is less than the wireless carrier frequency 508c, the averaged frequency error signal 244 of FIG. 2 is positive in phase and indicates an amount of shift needed to align the targeted frequency 510 and the wireless carrier frequency 508c at the null between frequency peaks 503 and 505.

The null tuning depicted in FIG. 5 may be used to provide interoperability between a tunable network with tighter frequency spacing and a legacy filter set. The link signal power budget and achievable distances may be limited due to filter attenuation, but this solution can be used for short distance links or metro area applications. Amplifiers or other means can be used to compensate for losses. Tuning to a null may also be used to limit the transmitted power levels, for link maintenance, variable attenuation of the signal, or other applications. When the wireless carrier frequency is misaligned to either side of a null, the frequency error signal oscillates at the dither modulation frequency, but is either in or out of phase depending on the direction of misalignment. Intermediate cases exhibit partial frequency doubling, making it possible to determine exactly where the wireless carrier frequency is positioned relative to the target frequency.

FIG. 6 depicts examples of signal frequency adjustments between frequency points on a comb filter. The transfer function of bandpass filter/splitter 216 of FIG. 2 may be arbitrary, provided that there is at least one peak or null within the frequency tuning range. In general, there may be multiple peaks and nulls as depicted in the FIG. 6. Plot 602 illustrates a frequency response 604 of the bandpass filter/splitter 216 of FIG. 2 as a comb filter. Modulated frequency spectrum 606a represents frequency content of the modulated signal 214 of FIG. 2, with a wireless carrier frequency 608a at the center of the modulated frequency spectrum 606a. In this example, a target frequency 609 may shift from the first peak of the frequency response 604 to target frequency 610 at the third peak of the frequency response 604. Plot 612 is an example of the dither modulation signal 204 of FIG. 2. Plot 614 represents the dither modulation frequency component of the modulated frequency spectrum 606a after passing through the frequency response 604. Plot 616 is an example of the vector cross product signal 236 of FIG. 2, and plot 618 is an example of the averaged frequency error signal 244 of FIG. 2 used for frequency adjustment.

Plot 620 depicts alignment of the wireless carrier frequency 608b of modulated frequency spectrum 606b relative to the targeted frequency 610, where modulated frequency spectrum 606b and wireless carrier frequency 608b are frequency adjusted versions of modulated frequency spectrum 606a and wireless carrier frequency 608a. Plot 622 is an example of the dither modulation signal 204 of FIG. 2. Plot 624 represents the dither modulation frequency component of the modulated frequency spectrum 606b after passing through the frequency response 604. Plot 626 is an example of the vector cross product signal 236 of FIG. 2, and plot 628 is an example of the averaged frequency error signal 244 of FIG. 2 used for frequency adjustment. Since wireless carrier frequency 608b aligns with targeted frequency 610, the dither modulation frequency increases. Widening the bandwidth of the modulated frequency spectrum 606b can include multiple peaks of the frequency response 604, which produces multiples of the dither modulation frequency. The resulting vector cross product signal 236 of FIG. 2 is zero and the averaged frequency error signal 244 of FIG. 2 is also zero, as shown in plots 624-628, thus no change is made to the signal bias block 206.

To make large changes across multiple frequency peaks and nulls, the FLL 114 of FIGS. 1 and 2 supports variable frequency resolution by varying one or more of an amplitude and frequency of the modulated signal 214 of FIG. 2 to span across two or more frequency peaks. The frequency error is monitored to determine a number of frequency peaks and nulls passed and a direction passed according to a relative frequency and phase of the frequency error to reach a targeted arbitrary point. The wireless carrier frequency is stepped to the targeted arbitrary point within a tolerance band based on the number of frequency peaks and nulls passed and the direction passed. The varied amplitude and/or frequency are reduced to narrow frequency resolution of the frequency error and increase frequency lock precision. Thus, a wide range of arbitrary points can be quickly navigated in the frequency response of the bandpass filter/splitter 216 of FIG. 2.

Figure 7:
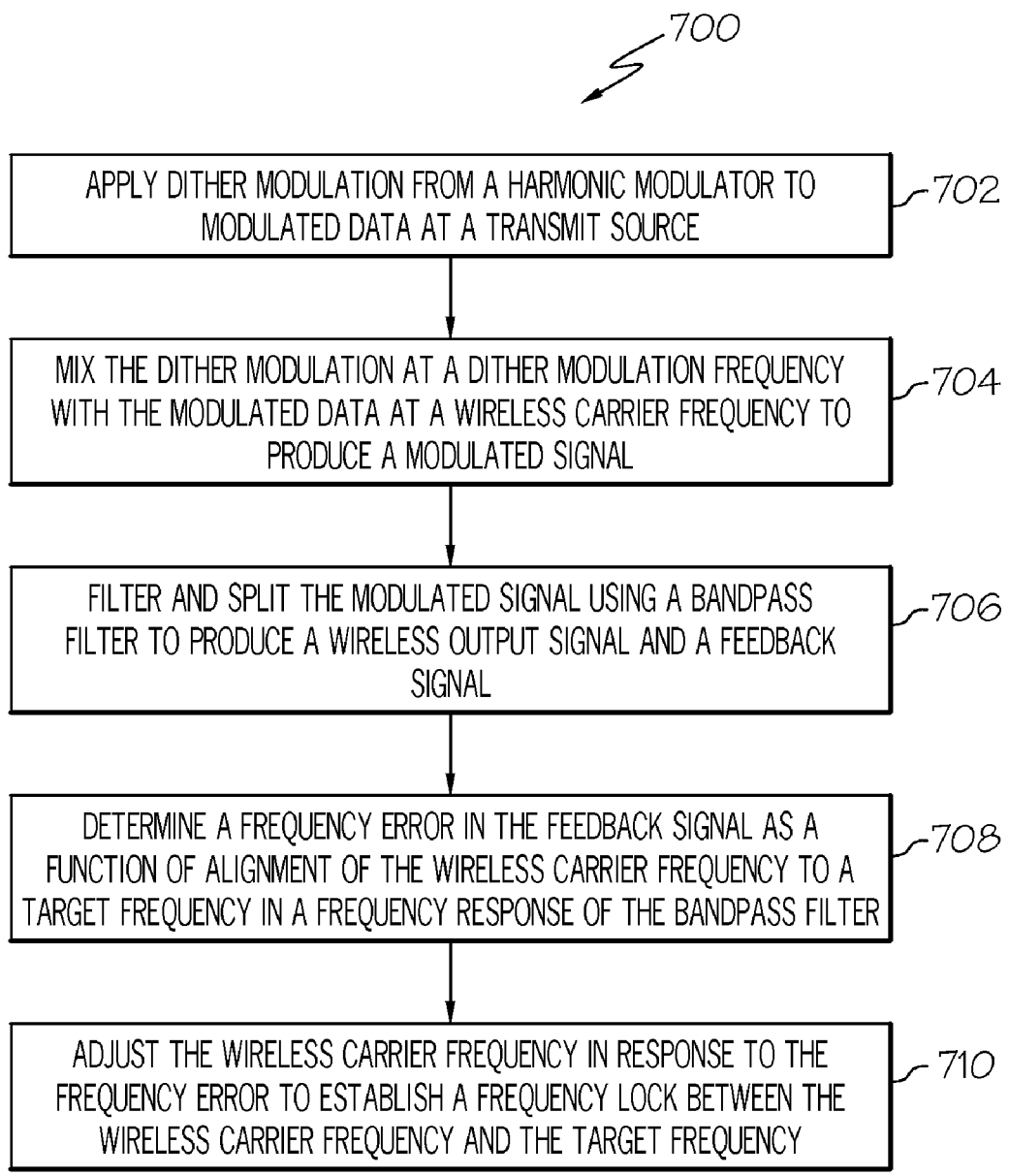
FIG. 7 depicts an exemplary frequency locked feedback loop process for wireless communications.

Turning now to FIG. 7, a frequency locked feedback loop process 700 for wireless communications will now be described in accordance with exemplary embodiments, and in reference to FIGS. 1-6. At block 702, dither modulation signal 204 from harmonic modulator 202 is applied to modulated data 212 at transmit source 210. The signal bias block 206 can be included between the harmonic modulator 202 and transmit source 210 to perform frequency adjustments to the transmit source 210.

At block 704, the transmit source 210 mixes the dither modulation signal 204 at a dither modulation frequency with the modulated data 212 at a wireless carrier frequency to produce modulated signal 214. In an exemplary embodiment, the wireless carrier frequency is the center frequency of the modulated signal 214.

At block 706, the modulated signal is filtered and split using bandpass filter/splitter 216 to produce wireless output signal 218 and feedback signal 220. The feedback signal 220 may be sampled and amplified before providing the feedback signal 220 to the frequency adjustment function 252.

At block 708, the frequency adjustment function 252 determines a frequency error in the feedback signal 220 as a function of alignment of the wireless carrier frequency to a target frequency in the frequency response of the bandpass filter/splitter 216.

At block 710, the wireless carrier frequency is adjusted in response to the frequency error to establish a frequency lock between the wireless carrier frequency and the target frequency. The target frequency is selectable as an arbitrary point, and the frequency error may be tracked as a nonequilibrium frequency error to adjust the wireless carrier frequency. As described in reference to FIGS. 4-6, the frequency response can be a periodic or comb filter, and the arbitrary point is selectable as a peak or a null between at least two frequency peaks. The output of the signal bias block 206 can also be shifted by shifter block 246 in response to values in calibration table 250.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A method for providing a frequency locked feedback loop for wireless communications, comprising:
    applying dither modulation from a harmonic modulator to modulated data at a transmit source;
    mixing the dither modulation at a dither modulation frequency with the modulated data at a wireless carrier frequency to produce a modulated signal;
    filtering and splitting the modulated signal using a bandpass filter to produce a wireless output signal and a feedback signal;
    determining a frequency error in the feedback signal as a function of alignment of the wireless carrier frequency to a target frequency in a frequency response of the bandpass filter; and
    adjusting the wireless carrier frequency in response to the frequency error to establish a frequency lock between the wireless carrier frequency and the target frequency.

2. The method of claim 1 wherein the frequency error is determined as a function of a vector cross product of the dither modulation and the feedback signal, the vector cross product producing a vector cross product signal.

3. The method of claim 2 further comprising:
    filtering the vector cross product signal using a lowpass filter to generate a filtered vector cross product;
    integrating and digitizing the filtered vector cross product over a period of time to produce an averaged frequency error; and
    applying the averaged frequency error to a signal bias block as the error signal, wherein the signal bias block adjusts the wireless carrier frequency.

4. The method of claim 3 wherein the amplitude of the averaged frequency error is proportional to an offset between the wireless carrier frequency and the target frequency, and a phase offset of the averaged frequency error is positive or negative as function of the wireless carrier frequency being higher or lower than the target frequency.

5. The method of claim 3 further comprising:
    shifting an output of the signal bias block in response to values in a calibration table.

6. The method of claim 1 wherein the target frequency in the frequency response of the bandpass filter is selectable as an arbitrary point, and the frequency error is tracked as a nonequilibrium frequency error to adjust the wireless carrier frequency.

7. The method of claim 6 wherein the frequency response of the bandpass filter is a comb filter comprising a plurality of frequency peaks, and the arbitrary point is selectable as a null between at least two of the plurality of frequency peaks.

8. The method of claim 7 further comprising:
    providing variable frequency resolution by varying one or more of an amplitude and frequency of the modulated signal to span across two or more of the plurality of frequency peaks;
    monitoring the frequency error to determine a number of frequency peaks and nulls passed and a direction passed according to a relative frequency and phase of the frequency error to reach the arbitrary point;
    stepping the wireless carrier frequency to the arbitrary point within a tolerance band based on the number of frequency peaks and nulls passed and the direction passed; and
    reducing the varied one or more of the amplitude and frequency to narrow frequency resolution of the frequency error and increase frequency lock precision.

9. The method of claim 1 further comprising:
    receiving the target frequency and the modulated data from a multicore device, wherein the multicore device periodically modifies the target frequency providing frequency tunable security for communications over a wireless network.

10. A system for a frequency locked feedback loop for wireless communications, comprising:
    a harmonic modulator to produce a dither modulation at a dither modulation frequency;
    a transmit source configured to mix the dither modulation at the dither modulation frequency with modulated data at a wireless carrier frequency to produce a modulated signal;
    a bandpass filter and splitter in communication with the transmit source and configured to output a wireless output signal and a feedback signal from the modulated signal; and
    a frequency adjustment function configured to determine frequency error in the feedback signal as a function of alignment of the wireless carrier frequency to a target frequency in a frequency response of the bandpass filter and command adjustment of the wireless carrier frequency in response to the frequency error to establish a frequency lock between the wireless carrier frequency and the target frequency.

11. The system of claim 10 wherein the frequency adjustment function further comprises:
    a vector cross product function configured to produce a vector cross product signal as a vector cross product of the dither modulation and the feedback signal.

12. The system of claim 11 further comprising a signal bias block between the harmonic modulator and the transmit source, wherein frequency adjustment function further comprises:
    a lowpass filter to filter the vector cross product signal and generate a filtered vector cross product; and
    an integrate and digitize function to produce an averaged frequency error by integrating and digitizing the filtered vector cross product over a period of time, wherein the averaged frequency error provides an adjustment command to the signal bias block to adjust the wireless carrier frequency.

13. The system of claim 12 wherein the amplitude of the averaged frequency error is proportional to an offset between the wireless carrier frequency and the target frequency, and a phase offset of the averaged frequency error is positive or negative as function of the wireless carrier frequency being higher or lower than the target frequency.

14. The system of claim 12 further comprising:
a shifter and a calibration table, wherein the shifter is configured to shift output of the signal bias block in response to values in the calibration table.

15. The system of claim 10 wherein the target frequency in the frequency response of the bandpass filter is selectable as an arbitrary point, and the frequency error is tracked as a nonequilibrium frequency error to adjust the wireless carrier frequency.

16. The system of claim 15 wherein the frequency response of the bandpass filter is a comb filter comprising a plurality of frequency peaks, and the arbitrary point is selectable as a null between at least two of the plurality of frequency peaks.

17. The system of claim 10 wherein the frequency adjustment function is implemented in digital signal processing circuitry.

18. The system of claim 10 further comprising:
a multicore device to provide the target frequency and the modulated data, wherein the multicore device is configured to periodically modify the target frequency as part of frequency tunable security for communications over a wireless network.

19. A wireless communication security system, comprising:
a multicore device in communication with a plurality of frequency locked feedback loops, wherein the plurality of frequency locked feedback loops are independently configurable to lock on separate target frequencies and output modulated data on wireless carrier frequencies aligned with the separate target frequencies, and the multicore device is configured to periodically modify the separate target frequencies to provide frequency tunable security for communications over a wireless network.

20. The wireless communication security system of claim 19 wherein each of the frequency locked feedback loops receives a selected target frequency from the multicore device, and each of the frequency locked feedback loops further comprises:
a transmit source configured to mix the dither modulation at the dither modulation frequency with modulated data at a wireless carrier frequency to produce a modulated signal;
a bandpass filter and splitter in communication with the transmit source and configured to output a wireless output signal and a feedback signal from the modulated signal; and
a frequency adjustment function configured to determine frequency error in the feedback signal as a function of alignment of the wireless carrier frequency to the selected target frequency in a frequency response of the bandpass filter and command adjustment of the wireless carrier frequency in response to the frequency error to establish a frequency lock between the wireless carrier frequency and the selected target frequency.

* * * * *